(12) United States Patent
Bi

(10) Patent No.: US 7,737,739 B1
(45) Date of Patent: Jun. 15, 2010

(54) PHASE STEP CLOCK GENERATOR

(75) Inventor: Han Bi, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 119 days.

(21) Appl. No.: 11/955,340

(22) Filed: Dec. 12, 2007

(51) Int. Cl.
*H03K 4/06* (2006.01)

(52) U.S. Cl. ...................... 327/135; 327/231

(58) Field of Classification Search ......... 327/291–299, 327/231–239, 243–245
See application file for complete search history.

(56) References Cited

U.S. PATENT DOCUMENTS

| | | | | |
|---|---|---|---|---|
| 4,888,564 | A * | 12/1989 | Ishigaki | 331/1 A |
| 5,629,649 | A * | 5/1997 | Ujiie | 331/17 |
| 6,014,417 | A * | 1/2000 | Hee et al. | 375/374 |
| 6,049,255 | A * | 4/2000 | Hagberg et al. | 331/17 |
| 6,292,051 | B1 * | 9/2001 | Su et al. | 329/313 |
| 6,295,272 | B1 * | 9/2001 | Feldman et al. | 370/210 |
| 6,396,889 | B1 | 5/2002 | Sunter et al. | |
| 6,426,947 | B1 * | 7/2002 | Banker et al. | 370/254 |
| 6,593,812 | B2 * | 7/2003 | Sundstrom | 330/136 |
| 6,754,025 | B1 * | 6/2004 | Shepherd et al. | 360/73.03 |
| 7,042,972 | B2 * | 5/2006 | Fahim | 375/376 |
| 7,075,866 | B2 * | 7/2006 | Nakamura et al. | 369/47.25 |
| 7,085,084 | B2 * | 8/2006 | Yasuna et al. | 360/51 |
| 7,095,287 | B2 * | 8/2006 | Maxim et al. | 331/44 |
| 7,265,633 | B1 * | 9/2007 | Stiff | 331/16 |
| 7,501,900 | B2 * | 3/2009 | Hull et al. | 331/16 |
| 2003/0156552 | A1 * | 8/2003 | Banker et al. | 370/266 |
| 2004/0004962 | A1 * | 1/2004 | Glazko et al. | 370/375 |
| 2004/0202271 | A1 * | 10/2004 | Fahim | 375/376 |
| 2005/0073369 | A1 * | 4/2005 | Balboni et al. | 331/16 |
| 2005/0102593 | A1 * | 5/2005 | Ko et al. | 714/733 |
| 2007/0268057 | A1 * | 11/2007 | Gopal et al. | 327/295 |
| 2007/0279135 | A1 * | 12/2007 | Hull et al. | |
| 2008/0025431 | A1 * | 1/2008 | Horikawa et al. | 375/295 |
| 2008/0164918 | A1 * | 7/2008 | Stockstad et al. | 327/157 |
| 2009/0039929 | A1 * | 2/2009 | Kossel | 327/157 |
| 2009/0080563 | A1 * | 3/2009 | Chen et al. | 375/271 |
| 2009/0086864 | A1 * | 4/2009 | Komninakis et al. | 375/346 |

* cited by examiner

*Primary Examiner*—Lincoln Donovan
*Assistant Examiner*—Adam D Houston
(74) *Attorney, Agent, or Firm*—Stanley J. Pawlik; Kenneth Glass; Glass & Associates

(57) ABSTRACT

An integrated circuit includes a phase step generator and a clock circuit. The phase step generator generates an input clock signal based on a reference clock and the clock circuit generates an output clock signal based on the input clock signal. Additionally, the clock circuit generates a feedback clock signal based on the output clock signal and locks a phase of the feedback clock signal with a phase of the input clock signal. In response to an assertion of a trigger signal, the phase step generator extends a phase of the input clock signal by inserting a phase step into the reference clock signal. A bandwidth of the clock circuit is determined based on the output clock signal after assertion of the trigger signal.

5 Claims, 8 Drawing Sheets

US 7,737,739 B1

PHASE STEP CLOCK GENERATOR

BACKGROUND

Many integrated circuits include a clock circuit for generating a clock signal. In some integrated circuits, the clock circuit includes a phase-lock loop for generating the clock signal based on a reference clock signal. In operation, the phase-lock loop generates a feedback clock signal by dividing a frequency of the clock signal and locks a phase and frequency of the feedback clock signal to a phase and frequency of the reference clock signal. Typically, operation of the phase-lock loop is tested along with the integrated circuit during manufacture of the integrated circuit. One type of test performed on the phase-lock loop determines whether the phase-lock loop operates properly over a specified bandwidth of the clock circuit including the phase-lock loop.

In one technique for testing a bandwidth of a clock circuit including a phase-lock loop, a programmable tester generates a test pattern for generating a reference clock signal at a specified frequency and determines whether the clock signal generated by the phase-lock loop is locked to the reference clock signal. If the clock signal generated by the phase-lock loop is locked to the reference clock signal, the tester generates additional test patterns for changing the phase of the reference clock signal and determines the bandwidth of the phase-lock loop based on phase differences between the output clock signal and the reference clock signal.

Although the technique of generating test patterns to change the phase of the reference clock signal has been successfully employed to measure bandwidths of clocks circuits, some integrated circuit manufacturers do not have access to a tester that is programmable to generate the test patterns required in this technique. In light of the above, a need exists for an improved method of testing a bandwidth of clock circuit. A further need exists for testing a bandwidth of a clock circuit including a phase-lock loop.

SUMMARY

In various embodiments, an integrated circuit includes a phase step generator and a clock circuit. The phase step generator generates an input clock signal based on a reference clock signal and the clock circuit generates an output clock signal based on the input clock signal. Additionally, the clock circuit generates a feedback clock signal by dividing a frequency of the output clock signal and locks the feedback clock signal in phase with the input clock signal. In response to an assertion of a trigger signal, the phase step generator extends a phase of the input clock signal by inserting a phase step into the reference clock signal. As a result, the feedback clock signal is no longer locked in phase with the input clock signal. The clock circuit then relocks the feedback clock signal in phase with the input clock signal. The bandwidth of the clock circuit is determined by measuring phase differences between the reference clock signal and the output clock signal after assertion of the trigger signal.

Because the phase step generator extends the phase of the input clock signal by inserting the phase step into the reference clock signal, a test pattern generating tester is not needed to generate the input clock signal or to determine whether the clock circuit has the specified bandwidth. Further, the phase step generator need not use the feedback clock signal of the clock circuit for generating the input clock signal or extending the phase of the input clock signal, which increases integrity of the input clock signal. Additionally, the phase step generator is not significantly affected by process, temperature, or voltage variations between the phase step generator and the clock circuit in the integrated circuit.

A phase step generator, in accordance with one embodiment, includes a synchronizer, a phase extender, and a filter. The synchronizer is configured to generate a synchronized trigger signal by synchronizing a trigger signal with a reference clock signal. The phase extender is coupled to the synchronizer and configured generate a phase-extended signal having an extended phase by inserting a phase step into the reference clock signal based on the synchronized trigger signal. The filter is coupled to the synchronizer and the phase extender. The filter is configured to generate the input clock signal by filtering the extended phase of the phase-extended signal based on the synchronized trigger signal and the reference clock signal.

An integrated circuit, in accordance with one embodiment, includes a clock circuit and a phase step generator coupled to the clock circuit. The clock circuit is configured to generate an output clock signal based on an input clock signal. The phase step generator is configured to generate the input clock signal based on a reference clock signal. Further, the phase step generator is configured to extend a phase of the input clock signal by inserting a phase step into the reference clock signal in response to a trigger signal for determining a bandwidth of the clock circuit.

A method, in accordance with one embodiment of, determines a bandwidth of a clock circuit embedded in an integrated circuit. The method includes generating an input clock signal based on a reference clock signal. The method also includes extending a phase of the input clock signal by inserting a phase step into the reference clock signal in response to a trigger signal. Additionally, the method includes generating an output clock signal based on an input clock signal and determining a bandwidth of the clock circuit based on the output clock signal.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In various embodiments, an integrated circuit includes a phase step generator and a clock circuit. The phase step generator generates an input clock signal based on a reference clock signal and clock circuit generates an output clock signal based on the input clock signal. Additionally, the lock circuit generates a feedback clock signal based on the output clock signal and locks the output clock signal in phase with the input clock signal. In response to an assertion of a trigger signal, the phase step generator extends a phase of the input clock signal by inserting a phase step into the reference clock signal for establishing a phase difference between the input clock signal and the feedback clock signal. Additionally, the tester measures phase differences between the reference clock signal and the output clock signal after assertion of the trigger signal and determines the bandwidth of the clock circuit based on the measured phase differences.

Figure 1:
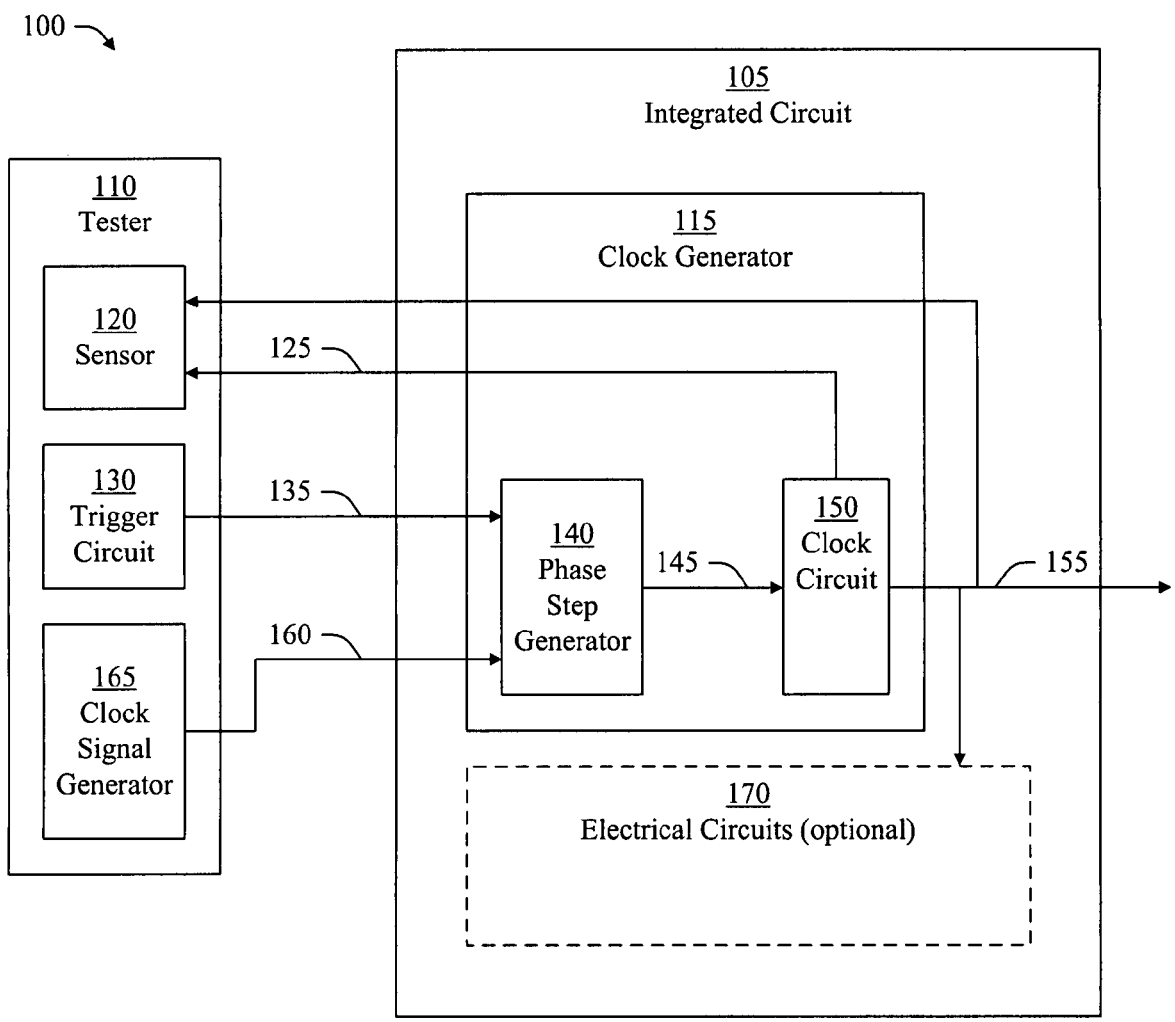
FIG. 1 is a block diagram of a test environment, in accordance with an embodiment of the present invention.

FIG. 1 illustrates a test environment 100, in accordance with an embodiment of the present invention. The test environment 100 includes an integrated circuit 105 and a tester 110. In operation, the tester 110 is coupled (e.g., connected) to the integrated circuit 105. The integrated circuit 105 includes a clock generator 115 and optional electrical circuits 170 coupled (e.g., connected) to the clock generator 115. The tester 110 generates a reference clock signal 160 and the clock generator 115 generates an output clock signal 155 based on the reference clock signal 160. In embodiments including the electrical circuits 170, the clock generator 115 provides the output clock signal 155 to the electrical circuits 170. The electrical circuits 170 may include any type of electrical circuit, component or device, such as a digital circuit, an analog circuit, a memory, a microprocessor, an embedded processor, electrical components, or the like, or any combination thereof. For example, the electrical circuits 170 may include a serializer-deserializer (SERDES) circuit. In some embodiments, the integrated circuit 105 outputs the output clock signal 155. In further embodiments, the tester 110 receives the output clock signal 155 generated by the integrated circuit 105 and determines a bandwidth of the clock generator 115 based on the output clock signal 155. In the embodiment of FIG. 1, the tester 110 is a standalone testing device and the integrated circuit 105 includes at least one semiconductor die mounted in a semiconductor package. For example, the integrated circuit 105 may be a single semiconductor die contained in a chip package or multiple semiconductor die contained in a multichip package.

In various embodiments, the tester 110 generates a trigger signal 135 for determining a bandwidth of the clock generator 115. In operation, the tester 110 asserts the trigger signal 135 and determines a bandwidth of the clock generator 115 based on the output clock signal 155. For example, the tester 110 may measure phase differences between the reference clock signal 160 and the output clock signal 155 and analyze the measured phase differences to determine a bandwidth of the clock generator 115. In one embodiment, the clock generator 115 generates a lock signal 125 based on the output clock signal 155 and the tester 110 measures phase differences between the reference clock signal 160 and the output clock signal 155 between assertion of the trigger signal 135 and subsequent assertion of the lock signal 125.

The clock generator 115 includes a phase step generator 140 and a clock circuit 150. The phase step generator 140 is coupled (e.g., connected) to the clock circuit 150. The phase step generator 140 generates an input clock signal 145 based on the reference clock signal 160 and the clock circuit 150 generates the output clock signal 155 based on the input clock signal 145. Additionally, the phase step generator 140 extends a phase (e.g., a half-cycle) of the input clock signal 145 by inserting a phase step into the reference clock signal 160 in response to an assertion of the trigger signal 135.

In some embodiments, the tester 110 includes a sensor 120, a trigger circuit 130, and a clock signal generator 165. In various embodiments, the sensor 120 captures data representing the reference clock signal 160 and the output clock signal 155. For example, the sensor 120 may be a digital oscilloscope capable of storing measured waveforms. The trigger circuit 130 generates and asserts the trigger signal 135. For example, the trigger circuit 130 may be a voltage source controlled by a switch, a state machine, a latch, a flip-flop, a register, a logic gate, or the like. The clock signal generator 165 may be any type of device for generating the reference clock signal 160 at a specified frequency. For example, the clock signal generator 165 may be a signal generator, a voltage-controlled oscillator, or the like.

In various embodiments, the tester 110 determines the bandwidth of the clock circuit 150 by comparing phase differences between the reference clock signal 160 and the output clock signal 155 after the trigger circuit 130 asserts the trigger signal 135. In response to the assertion of the trigger signal 135, the phase difference between the reference clock signal 160 and the output clock signal 155 typically increases and then decreases as the clock circuit 150 relocks the phase of the output clock signal 155 to the phase of the reference clock signal 160. The tester 110 then analyzes waveforms of the reference clock signal 160 and the output clock signal 155 to determine the bandwidth of the clock circuit 150. For example, the tester 110 may measure phase differences between the reference clock signal 160 and the output clock signal 155 based on waveforms of the reference clock signal 160 and the output clock signal 155 captured by the sensor 120, construct a step response based on the measured phase differences, and perform Fourier analysis on the step response to determine the bandwidth of the clock circuit 150. In some embodiments, the sensor 120 begins to capture waveforms of the reference clock signal 160 and the output clock signal 155 in response to assertion of the trigger signal 135 and stops capturing the waveforms in response to assertion of the lock signal 125.

In some embodiments, the tester 110 is programmable to generate the trigger signal 135 and determine if the clock circuit 150 has a specified bandwidth based on the output clock signal 155. In this way, the tester 110 may be used to automatically test integrated circuits 105 in an assembly line setup. In some embodiments, the sensor 120, the trigger circuit 130, or the clock signal generator 165, or any combination thereof, are individual devices that are not part of an integrated tester. In these embodiments, the bandwidth of the clock circuit 150 is determined using these individual components. For example, a person may operate the clock signal generator 165 and the trigger circuit 130, and observe the indicator generated by the sensor 120.

Figure 2:
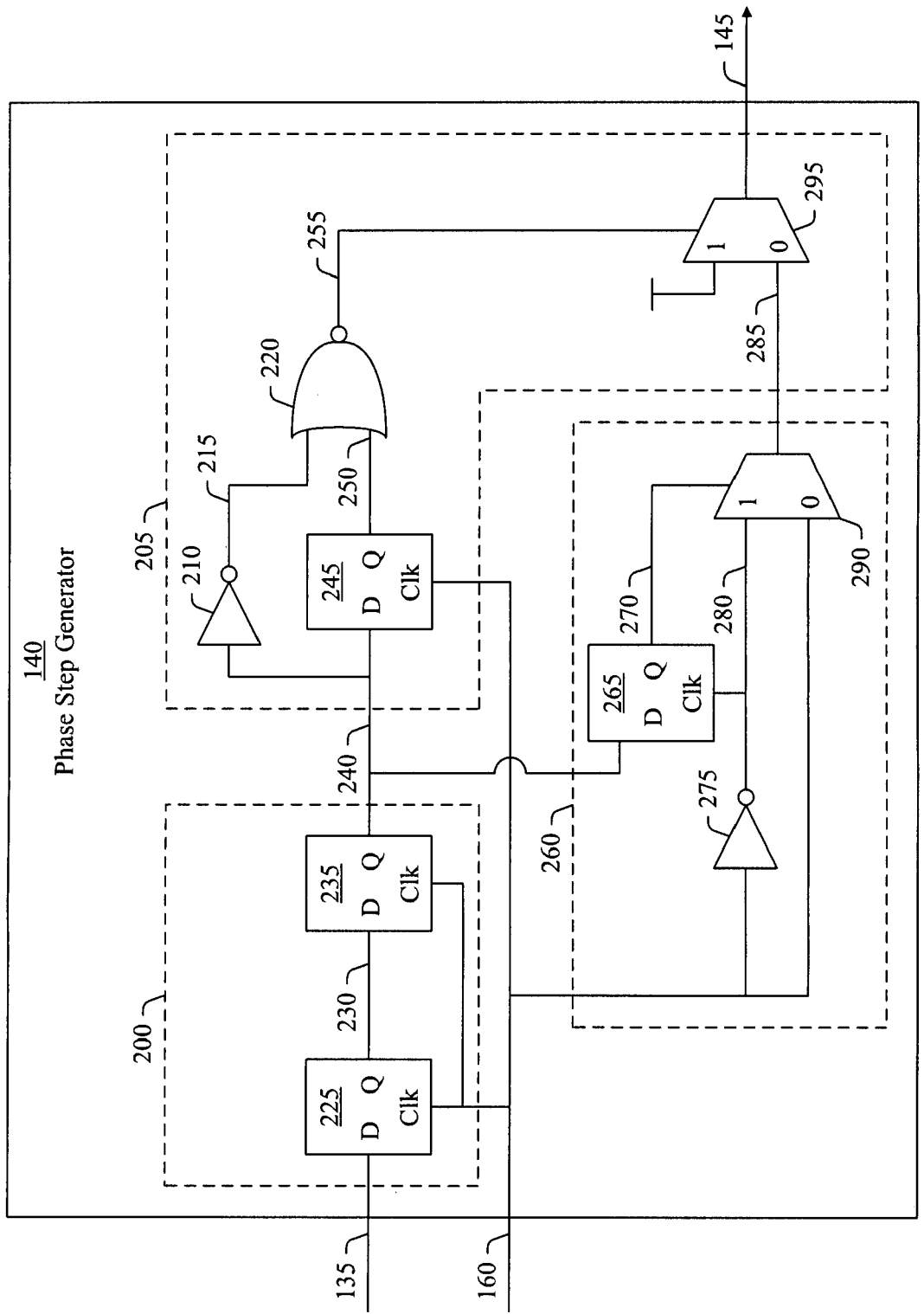
FIG. 2 is a schematic diagram of a phase step generator, in accordance with an embodiment of the present invention.

FIG. 2 illustrates the phase step generator 140, in accordance with an embodiment of the present invention. The phase step generator 140 includes a synchronizer 200, a filter 205, and a phase extender 260. The synchronizer 200 generates a synchronized trigger signal 240 by synchronizing the trigger signal 135 with the reference clock signal 160. The phase extender 260 generates a phase-extended signal 285 by inserting a phase step into the reference clock signal 160 based on the synchronized trigger signal 240. The filter 205 generates the input clock signal 145 by filtering the phase-extended signal 285 based on the synchronized trigger signal 240 and the reference clock signal 160. In various embodiments, the filter 205 filters the phase-extended signal 285 by suppressing one or more transient signals in the phase-extended signal 285, as is described more fully herein.

In various embodiments, the synchronizer 200 includes a series of latches for synchronizing the trigger signal 135 with the reference clock signal 160. A first latch in the series of latches generates an output signal by latching the trigger signal 135 based on the reference clock signal 160. Each successive latch in the series of latches generates an output signal by latching the output signal of the previous latch in the series. Moreover, the output signal generated by the last latch in the series of latches is the synchronized trigger signal 240.

As illustrated in the embodiment of FIG. 2, the synchronizer 200 includes a latch 225 and a latch 235. The latch 225 is coupled (e.g., connected) to the latch 235. The latch 225 generates a buffered trigger signal 230 by latching the trigger signal 135 based on the reference clock signal 160. The latch 235 generates the synchronized trigger signal 240 by latching the buffered trigger signal 230 based on the reference clock signal 160. In some cases, the latch 225 may be in a metastable state after latching the trigger signal 135. Although the buffered trigger signal 230 may temporarily have an indeterminate logic state when the latch 225 is in the metastable state, the latch 235 generates the synchronized trigger signal 240 having a determinate logic state. In this way, the synchronizer 200 synchronizes the trigger signal 135 with the reference clock signal 160.

In some embodiments, the latch 225 or the latch 235, or both, are level triggered latches. In some embodiments, the latch 225 or the latch 235, or both, are edge-triggered latches (e.g., flip-flop circuits). For example, the latch 225 and the latch 235 may both be data flip-flops. In other embodiments, the synchronizer 200 is external of the phase step generator 140. In some embodiments, the synchronizer 200 is external of the integrated circuit 105. For example, the tester 110 may include the synchronizer 200.

In various embodiments, the phase extender 260 generates the phase-extended signal 285 by inserting a phase step into the reference clock signal 160. The phase-extended signal 285 represents the reference clock signal 160 but has a phase extended by the phase step (e.g., an extended phase). Moreover, the phase step has a duration of half a cycle (e.g., a half cycle) of the reference clock signal 160. In this way, the phase-extended signal 285 has an extended cycle having a duration that is one-and-a-half times a cycle in the reference clock signal 160. In some embodiments, the extended cycle is an asymmetrical cycle in which one phase of the extended cycle has a duration that is twice a duration of another phase of the extended cycle. For example, a duration of a first phase of the extended cycle may be twice a duration of a second phase following the first phase in the extended cycle.

As illustrated in the embodiment of FIG. 2, the phase extender 260 includes a latch 265, an inverter 275, and a selector 290. The inverter 275 is coupled (e.g., connected) to the latch 265 and the selector 290. Additionally, the latch 265 is coupled (e.g., connected) to the selector 290. The latch 265 may be a register, a level-triggered latch, or an edge-trigger latch, such as a data flip-flop. The selector 290 may be a multiplexer or a logic circuit that performs a function equivalent to a function performed by a multiplexer. The inverter 275 generates an inverted reference clock signal 280 by inverting the reference clock signal 160. The latch 265 generates an offset trigger signal 270 based on the synchronized trigger signal 240 and the inverted reference clock signal 280, for example by synchronizing the synchronized trigger signal 240 with the inverted reference clock signal 280. The selector 290 generates the phase-extended signal 285 by selecting the reference clock signal 160 or the inverted reference clock signal 280 based on the offset trigger signal 270.

In operation, the selector 290 passes the reference clock signal 160 as the phase-extended signal 285 when the offset trigger signal 270 is not asserted (e.g., deasserted). The latch 265 then asserts the offset trigger signal 270 based on the inverted reference clock signal 280 after the synchronized trigger signal 240 is asserted. In response to the assertion of the offset trigger signal 270, the selector 290 inserts a phase step into the reference clock signal 160 by selecting the inverted reference clock signal 280 instead of the reference clock signal 160 and passing the inverted reference clock signal 280 as the phase-extended signal 285. In some instances, because of propagation delays in components of the phase step generator 140, the selector 290 may introduce (e.g., generate) one or more transient signals (e.g., glitches) in the phase-extended signal 285 when the selector 290 transitions from selecting the reference clock signal 160 to selecting the inverted reference clock signal 280.

In various embodiments, the filter 205 filters the phase-extended signal 285 by removing one or more transient signals in the phase-extended signal 285. In one embodiment, the filter 205 generates a filter signal 255 based on the synchronized trigger signal 240 and the reference clock signal 160 and filters the phase-extended signal 285 based on the filter signal 255, for example by combining the phase-extended signal 285 with the filter signal 255. For example, the filter signal 255 may include a pulse and the filter 205 may replace a portion of the phase-extended signal 285 with the pulse of the filter signal 255 to suppress a transient signal in the phase-extended signal 285.

In the embodiment of FIG. 2, the filter 205 includes an inverter 210, a NOR circuit 220, a latch 245, and a selector 295. The inverter 210 is coupled (e.g., connected) to the latch 245 and the NOR circuit 220, and the latch 245 is coupled (e.g., connected) to the NOR circuit 220. An input of the selector 295 is coupled (e.g., connected) an output of the NOR circuit and another input of the selector 295 is coupled (e.g., connected) to a reference voltage, such as a supply voltage of the phase step generator 140. In various embodiments, the latch 245 may be a level-triggered latch or an edge-trigger latch, such as a data flip-flop.

The inverter 210 generates an inverted trigger signal 215 by inverting the synchronized trigger signal 240. The latch 245 generates a delayed trigger signal 250 by synchronizing the synchronized trigger signal 240 with the reference clock signal 160. In this way, the latch 245 generates the delayed trigger signal 250 by delaying the synchronized trigger signal 240 by a clock cycle of the reference clock signal 160.

The NOR circuit 220 generates the filter signal 255 based on the inverted trigger signal 215 and the delayed trigger signal 250, for example by performing a logic OR operation on the inverted trigger signal 215 and the delayed trigger signal 250 and inverting the result of the operation. The filter signal 255 includes a pulse having a duration of a clock cycle of the reference clock signal 240. The selector 295 generates the input clock signal 145 by selecting the phase-extended signal 285 or the reference voltage based on the filter signal 255. In operation, the selector 295 selects and passes the phase-extended signal 285 when the filter signal 255 is deasserted and selects and passes the reference voltage when the filter signal 255 is asserted (e.g., during the pulse of the filter signal 255). In this way, the selector 295 replaces a portion of the phase-extended signal 285 with the reference voltage. By replacing the portion of the phase-extended signal 285 with the reference voltage, the selector 295 may suppress one or more transient signals in the phase-extended signal 285.

The inverter 210, the NOR circuit 220, and the selector 295 comprise a combinational logic circuit in the filter 205. In other embodiments, the combinational logic circuit of the filter 205 may include components other than the inverter 210, the NOR circuit 220, and the selector 295 for filtering the phase-extended signal 285. For example, the combinational logic circuit may include a complex gate (e.g., a standard cell) for generating the input clock signal 145 based on the phase-extended signal 285, the synchronized trigger signal 240, and the delayed trigger signal 250. As another example, the selector 295 may be an OR circuit that generates the input clock signal 145 based on the filter signal 255 and the phase-extended signal 285, for example by performing a logic OR operation on the filter signal 255 and the phase-extended signal 285.

Figure 3:
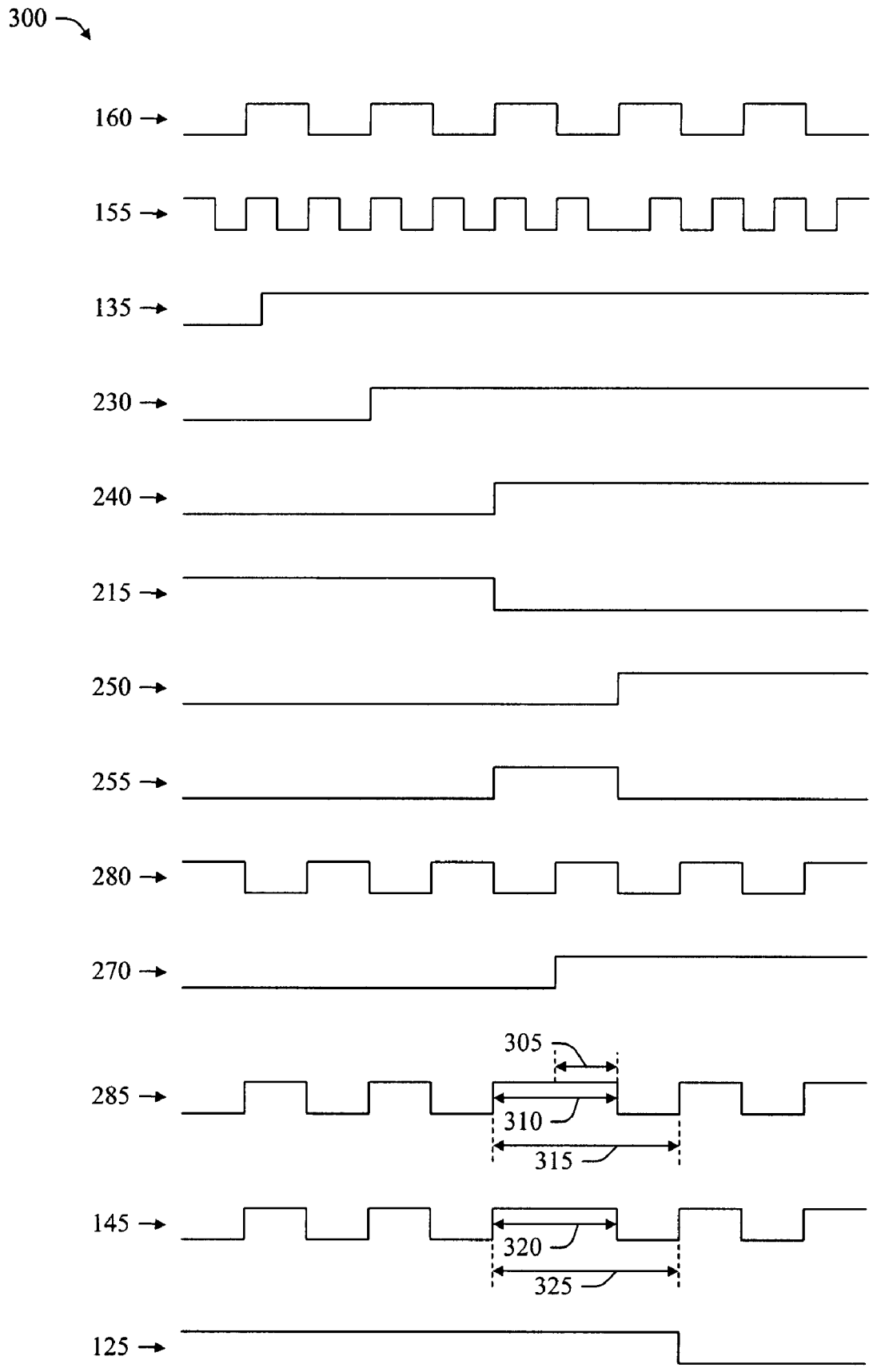
FIG. 3 is a diagram of waveforms for signals in a clock generator, in accordance with an embodiment of the present invention.

FIG. 3 illustrates waveforms 300 for signals in the clock generator 115, in accordance with an embodiment of the present invention. Initially, the output clock signal 155 is locked in phase with the reference clock signal 160. As illustrated in FIG. 3, rising edges of the output clock signal 155 are initially locked in phase with rising edges of the reference clock signal 160 as indicated by the lock signal 125. The reference clock signal 160 includes clock cycles each having a positive phase in which the reference clock signal 160 has a high voltage level and a negative phase in which the reference clock signal 160 has a low voltage. The trigger signal 135 is asserted after a first rising edge of the reference clock signal 160. The latch 225 asserts the buffered clock signal 230 at a second rising edge of the reference clock signal 160. The latch 235 asserts the synchronized trigger signal 240 at a third rising edge of the reference clock signal 160.

The inverter 210 deasserts the inverted trigger signal 215 at the third rising edge of the reference clock signal 160. The latch 245 asserts the delayed trigger signal 250 at a fourth rising edge of the reference clock signal 160. The NOR circuit 220 generates the filter signal 255 having a pulse extending between the third rising edge of the reference clock signal 160 and the fourth rising edge of the reference clock signal 160.

The inverter 275 generates the inverted reference clock signal 280 such that rising edges of the reference clock signal 160 occur at corresponding falling edges of the inverted reference clock signal 280. The latch 265 asserts the offset trigger signal 270 at a third rising edge of the inverted reference clock signal 280, which occurs between the third rising edge of the reference clock signal 160 and the fourth rising edge of the reference clock signal 160. The selector 290 generates the phase-extended signal 285 by passing the reference clock signal 160 when the offset trigger signal 270 is deasserted and passing the inverted reference clock signal 280 when the offset trigger signal 270 is asserted. In this way, the selector 290 inserts a phase step 305 into the reference clock signal 160. As illustrated in FIG. 3, the phase-extended signal 285 includes an extended phase 310 in an extended cycle 315. The selector 295 generates the input clock signal 145 by passing the phase-extended signal 285 when the filter signal 255 is deasserted and a reference voltage when the filter signal 255 is asserted. As illustrated in FIG. 3, the input clock signal 145 has an extended phase 320 in an extended cycle 325.

In one embodiment, the selector 295 performs a logic OR operation to combine the phase-extended signal 285 with the filter signal 255. In this embodiment, the selector 295 generates the input clock signal 145 by suppressing transients in the phase-extended signal 285 during the pulse of the filter signal 255. In this way, the selector 295 suppresses transients in the extended cycle 315 of the phase-extended signal 285. In some embodiments, the clock circuit 150 deasserts the lock signal 125 after the fourth rising edge of the reference clock signal 160. For example, the clock circuit 150 may deassert the lock signal 125 between the fourth rising edge of the reference clock signal 160 and a fifth rising edge of the reference clock signal 160 indicating that the output clock signal 155 is no longer locked in phase with the reference clock signal 160.

Figure 4:
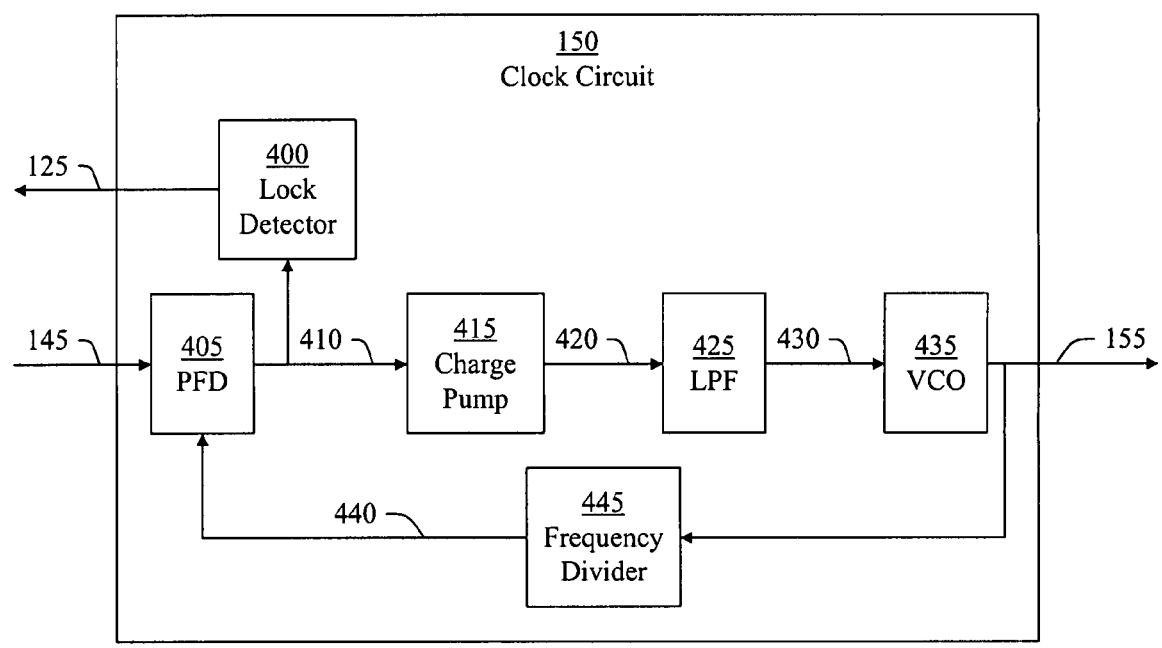
FIG. 4 is a block diagram of a clock circuit, in accordance with an embodiment of the present invention.

FIG. 4 is a block diagram of the clock circuit 150, in accordance with an embodiment of the present invention. In this embodiment, the clock circuit 150 is a phase-lock loop. The clock circuit 150 includes lock detector 400, a phase-frequency detector (PFD) 405, a charge pump 415, a low-pass filter (LPF) 425, a voltage-controlled oscillator (VCO) 435, and a frequency divider 445. The charge pump 415 is coupled (e.g., connected) to the phase-frequency detector 405 and the low-pass filter 425. The voltage-controlled oscillator 435 is coupled (e.g. connected) to the low-pass filter 425 and the frequency divider 445. Additionally, the frequency divider 445 is coupled (e.g., connected) to the phase-frequency detector 405.

The phase-frequency detector 405 generates a phase signal 410 based on the input clock signal 145 a feedback clock signal 440 generated by the frequency divider 445. The phase signal 410 indicates a phase difference between the input clock signal 145 and the feedback clock signal 440. For example, the phase signal 410 may indicate whether a phase of the input clock signal 145 leads or lags the phase of the feedback clock signal 440. The charge pump 415 generates a voltage signal 420 based on the phase signal 410 for adjusting a frequency of the output clock signal 155. The voltage signal 420 indicates a voltage representing a phase difference between the input clock signal 145 and the feedback clock signal 440. The low-pass filter 425 generates a control signal 430 by filtering the voltage signal 420. The low-pass filter 425 may be any type of electrical circuit that filters out higher frequency components of the voltage signal 420 and passes lower frequency components of the voltage signal 420. In various embodiments, the control signal 430 indicates a voltage for generating a frequency of the output clock signal 155. The voltage-controlled oscillator 435 generates the output clock signal 155 based on control signal 430. The frequency divider 445 generates the feedback clock signal 440 by dividing a frequency of the output clock signal 155 by a divisor.

In operation, the clock circuit 150 locks a phase and frequency of the feedback clock signal 440 to a phase and frequency of the input clock signal 145. In this way, the clock circuit 150 locks the output clock signal 155 to the input clock signal 145. Further, clock circuit 150 locks the frequency of the output clock signal 155 to the frequency of the input clock signal 145 based on the divisor of the frequency divider 445. For example, if the frequency of the input clock signal 145 is one-hundred megahertz (100 Mhz) and the divisor of the frequency divider 445 is ten, the clock circuit 150 locks the frequency of the output clock signal 155 at ten megahertz (10 MHz). In some embodiments, the tester 110 measures phase differences between the reference clock signal 160 and the output clock signal 155 by measuring phase differences between the reference clock signal 160 and the feedback clock signal 440. In these embodiments, the clock circuit 150 provides the feedback clock signal 440 (e.g., a buffered feedback clock signal 440) to the tester 110.

The lock detector 400 generates the lock signal 125 indicating whether the output clock signal 155 is locked to the input clock signal 145. In various embodiments, the lock signal 125 indicates the output clock signal 155 is locked to the input clock signal 145 if the feedback clock signal 440 is locked in phase with the input clock signal 145. In one embodiment, the lock detector 400 generates the lock signal 125 based on the phase signal 410. In another embodiment, the lock detector 400 generates the lock signal 125 based on the input clock signal 145 and the feedback clock signal 440. In still another embodiment, the lock detector 400 generates the lock signal 125 based on the input clock signal 145 and the output clock signal 155.

In other embodiments, the clock circuit 150 may be another type of circuit for generating an output clock signal 155 based on a feedback signal derived from the output clock signal 155. For example, the clock circuit 150 may be a delay lock loop. In some embodiments, the output clock signal 155 does not depend upon a feedback clock signal derived from the output clock signal 155. In these embodiments, the lock detector 400 may compare a frequency of the output clock signal 155 with a frequency of the input clock signal 145 to determine whether the frequency of the output clock signal 155 is a specified multiple (e.g., a predetermined multiple) of the frequency of the input clock signal 145.

Figure 5:
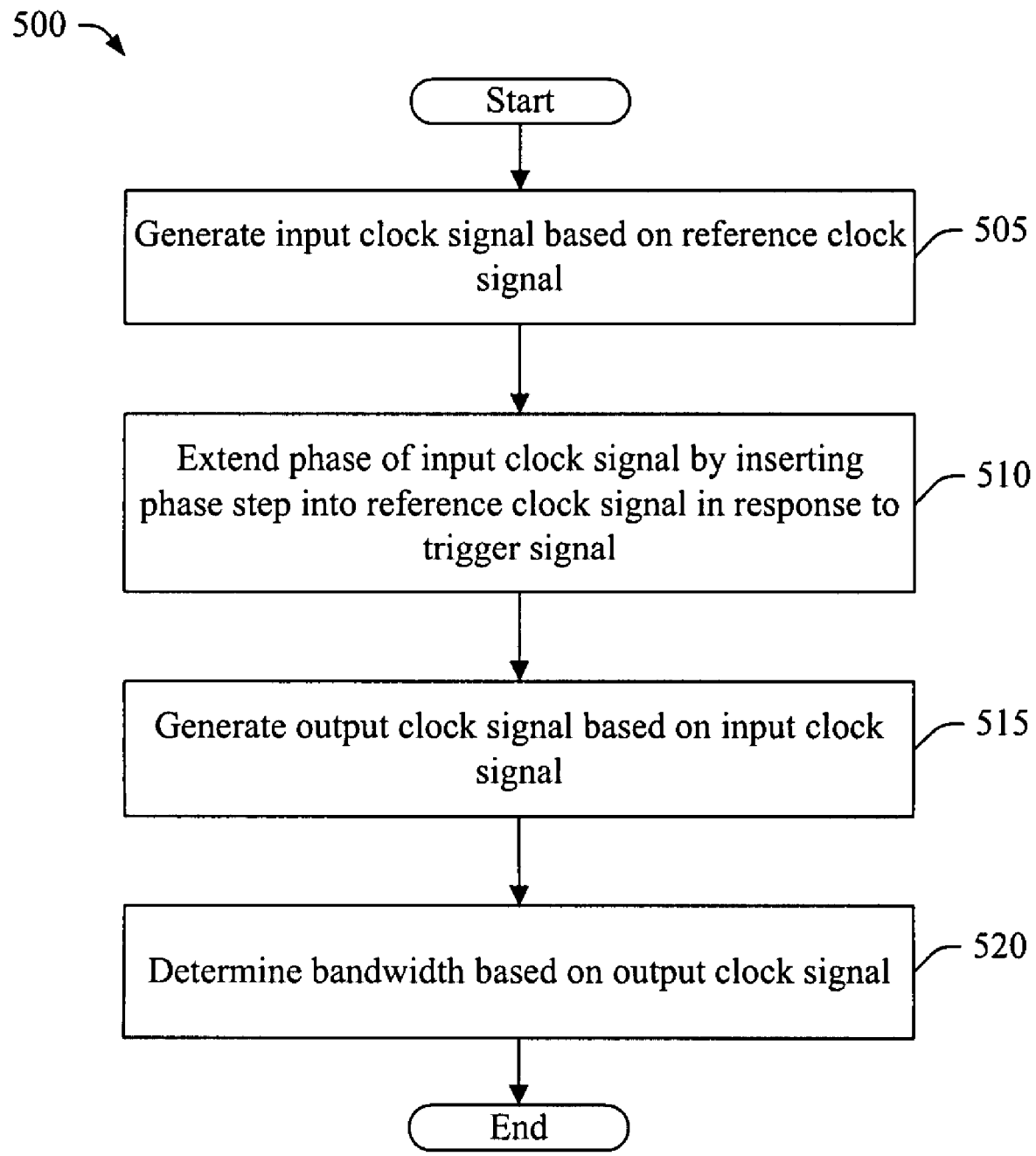
FIG. 5 is a flow chart for a method of generating a clock signal having a phase step, in accordance with an embodiment of the present invention.

FIG. 5 illustrates a method 500 of determining a bandwidth of a clock circuit, in accordance with an embodiment of the present invention. In step 505, the input clock signal 145 is generated based on the reference clock signal 160. In one embodiment, the phase step generator 140 generates the input clock signal 145 based on the reference clock signal 160 by passing the reference clock signal 160 as the input clock signal 145. In some embodiments, the integrated circuit 105 includes the phase step generator 140. In further embodiments, the clock signal generator 165 generates the reference clock signal 160 and the phase step generator 140 receives the reference clock signal 160 from the clock signal generator 165. The method 500 then proceeds to step 510.

In step 510, a phase of an input clock signal is extended by inserting a phase step into a reference clock signal in response to a trigger signal. In one embodiment, the phase step generator 140 extends the phase of the input clock signal 145 by inserting the phase step into the reference clock signal 160 in response to the trigger signal 135. The method 500 then proceeds to step 515.

In step 515, an output clock signal is generated based on an input clock signal. In one embodiment, the clock circuit 150 generates the output clock signal 155 based on the input clock signal 145. The method 500 then proceeds to step 520.

In step 520, a bandwidth is determined based on an output clock signal. In one embodiment, the sensor 120 captures waveforms of the reference clock signal 160 and the output clock signal 155 and the tester 110 measures phase differences between the reference clock signal 160 and the output clock signal 155. Further, the tester 110 determines a bandwidth of the clock circuit 150 based on the measured phase differences. For example, the tester 110 may construct a step response based on the measured phase differences and perform Fourier analysis on the step response to determine the bandwidth of the clock circuit 150.

In an alternative embodiment, the tester 110 captures waveforms of the reference clock signal 160 and the feedback clock signal 440, measures phase differences between the reference clock signal 160 and the feedback clock signal 440, constructs a step response based on the measured phase differences, and determines the bandwidth of the clock circuit 150 based on the step response. The method 500 then ends.

Figure 6:
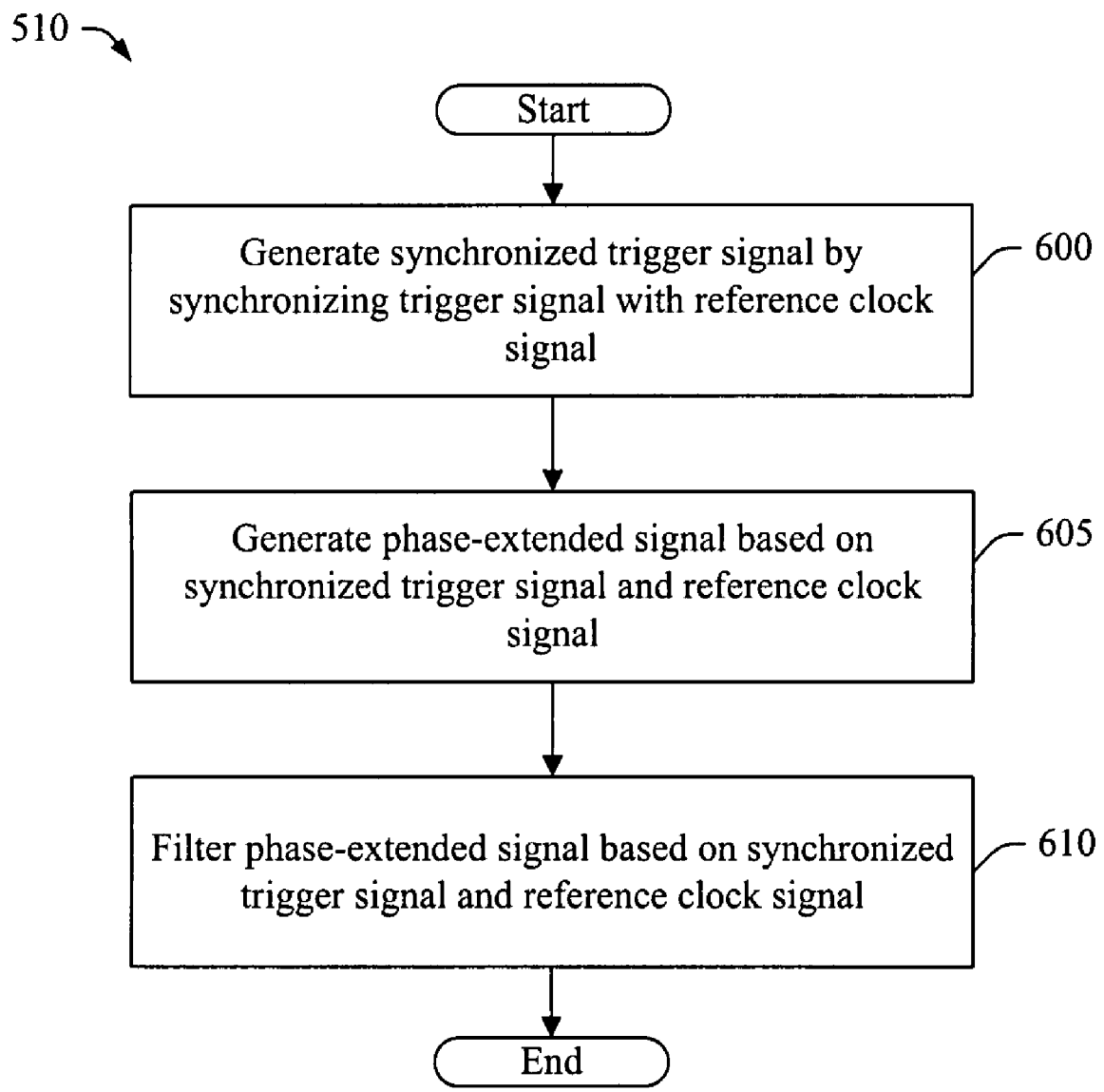
FIG. 6 is a flow chart of a portion of a method of generating a clock signal having a phase step, in accordance with an embodiment of the present invention.

FIG. 6 illustrates a portion of a method of determining a bandwidth of a clock circuit, in accordance with an embodiment of the present invention. The portion of the method illustrated in FIG. 6 is an embodiment of the step 510 illustrated in FIG. 5. In step 600, a synchronized trigger signal is generated by synchronizing a trigger signal with a reference clock signal. In one embodiment, the synchronizer 200 generates the synchronized trigger signal 240 by synchronizing the trigger signal 135 with the reference clock signal 160. The method 500 then proceeds to step 605.

In step 605, a phase-extended signal is generated based on a synchronized trigger signal and a reference clock signal. In one embodiment, the phase extender 260 generates the phase-extended signal 285 based on the reference clock signal 160 and the synchronized trigger signal 240. The method 500 then proceeds to step 610.

In step 610, a phase-extended signal is filtered based on a synchronized trigger signal and a reference clock signal. In one embodiment, the filter 205 filters the phase-extended signal 285 based on the synchronized trigger signal 240 and the reference clock signal 160. This portion of the method 500 then ends.

Figure 7:
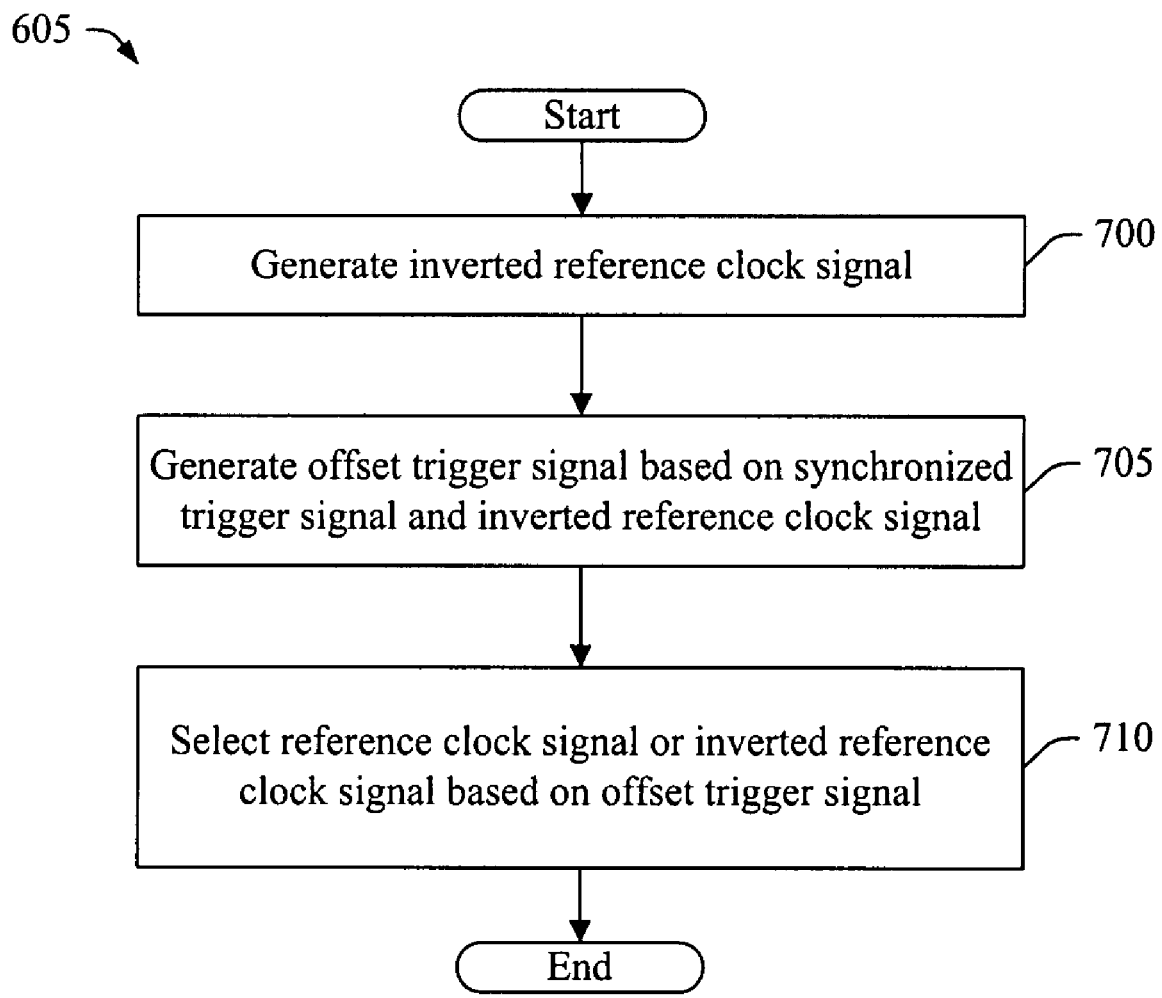
FIG. 7 is a flow chart of a portion of a method of generating a clock signal having a phase step, in accordance with an embodiment of the present invention.

FIG. 7 illustrates a portion of a method of determining a bandwidth of a clock circuit, in accordance with an embodiment of the present invention. The portion of the method illustrated in FIG. 7 is an embodiment of the step 605 illustrated in FIG. 6. In step 700, an inverted reference clock signal is generated. In one embodiment, the inverter 275 generates the inverted reference clock signal 280. The method 500 then proceeds to step 705.

In step 705, an offset trigger signal is generated based on a synchronized trigger signal and an inverted reference clock signal. In one embodiment, the latch 265 generates the offset trigger signal 270 based on the synchronized trigger signal 240 and the inverted reference clock signal 280. The method 500 then proceeds to step 710.

In step 710, a reference clock signal or an inverted reference clock signal is selected based on an offset trigger signal. In one embodiment, the selector 290 selects the reference clock signal 160 or the inverted reference clock signal 280 based on the offset trigger signal 270. This portion of the method 500 then ends.

Figure 8:
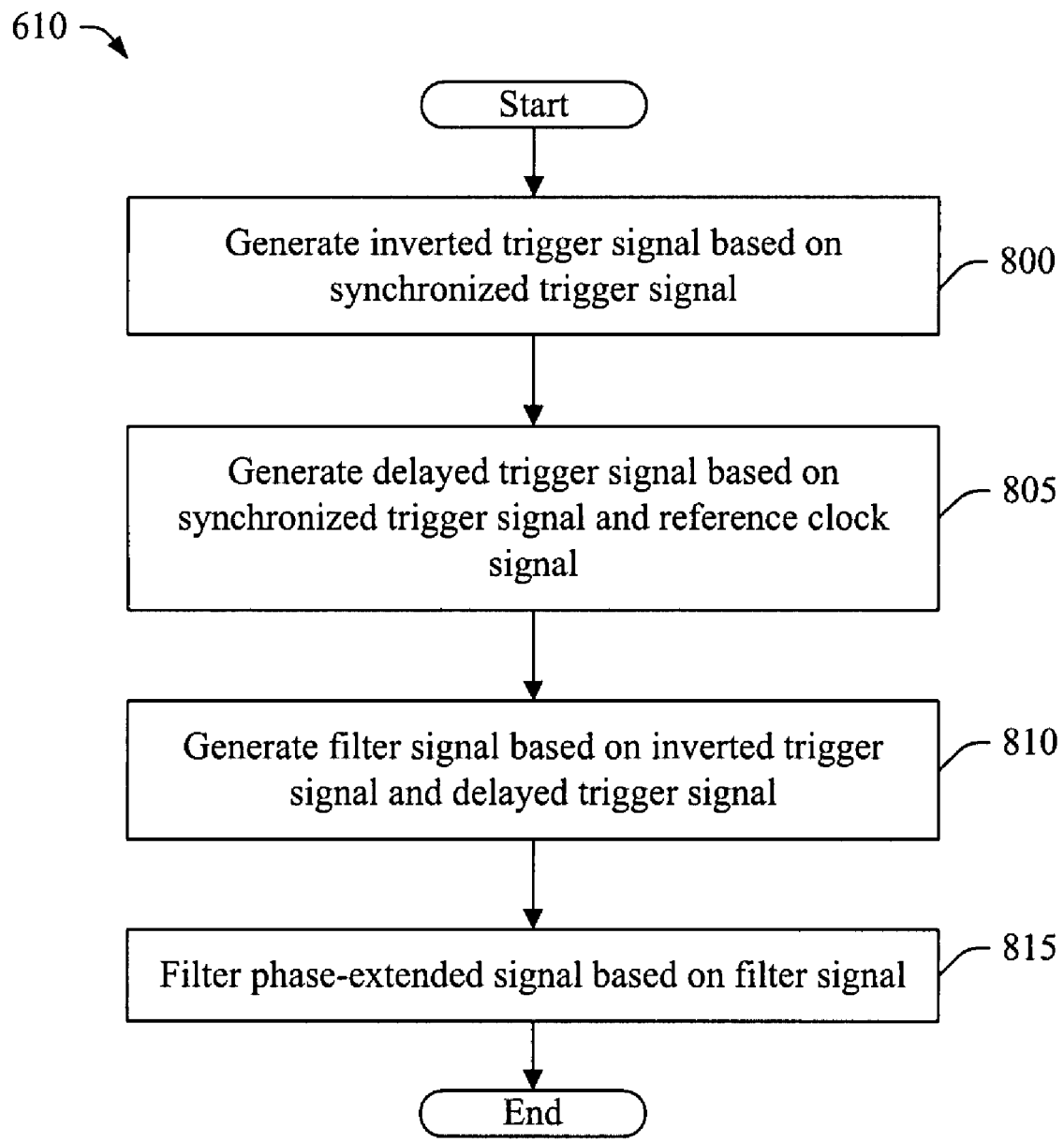
FIG. 8 is a flow chart of a portion of a method of generating a clock signal having a phase step, in accordance with an embodiment of the present invention.

FIG. 8 illustrates a portion of a method of determining a bandwidth of a clock circuit, in accordance with an embodiment of the present invention. The portion of the method illustrated in FIG. 8 is an embodiment of the step 610 illustrated in FIG. 6. In step 800, an inverted trigger signal is generated based on a synchronized trigger signal. In one embodiment, the inverter 210 generates the inverted trigger signal 215 based on the synchronized trigger signal 240. The method 500 then proceeds to step 805.

In step 805, a delayed trigger signal is generated based on a synchronized trigger signal and a reference clock signal. In one embodiment, the latch 245 generates the delayed trigger signal 250 based on the synchronized trigger signal 240 and the reference clock signal 160. The method 500 then proceeds to step 810.

In step 810, a filter signal is generated based on an inverted trigger signal and a delayed trigger signal. In one embodiment, the NOR circuit 220 generates the filter signal 255 based on the inverted trigger signal 215 and the delayed trigger signal 250. The method 500 then proceeds to step 815

In step 815, a phase-extended signal is filtered based on a filter signal. In one embodiment, the selector 295 filters the phase-extended signal 285 based on the filter signal 255. This portion of the method 500 then ends.

In various embodiments, some or all of the steps of the method 500 described herein and illustrated in FIGS. 5-8 may be performed in parallel with each other or substantially simultaneously. In some embodiments, the method 500 may include more or fewer than the steps described herein and illustrated in FIGS. 5-8. In some embodiments, the steps of the method 500 may be performed in a different order than the order described herein and illustrated in FIGS. 5-8.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method of determining a bandwidth of a clock circuit embedded in an integrated circuit, the method comprising:
   generating an input clock signal based on a reference clock signal;
   extending a phase of the input clock signal by inserting a phase step into the reference clock signal in response to a trigger signal;
   generating an output clock signal based on the input clock signal; and
   determining a bandwidth of the clock circuit based on the output clock signal by measuring phase differences between the reference clock signal and the output clock signal, constructing a step response based on the measured phased differences and determining the bandwidth of the clock circuit based on the step response.

2. The method of claim 1, wherein the phase step has a duration of a half cycle in the reference clock signal.

3. The method of claim 1, wherein determining the bandwidth of the clock circuit based on the step response comprises performing Fourier analysis on the step response.

4. A method of determining a bandwidth of a clock circuit embedded in an integrated circuit, the method comprising:
   generating an input clock signal based on a reference clock signal;
   extending a phase of the input clock signal by inserting a phase step into the reference clock signal in response to a trigger signal;
   generating an output clock signal based on the input clock signal; and
   generating a lock signal based on the output clock signal;
   determining the bandwidth of the clock circuit based on the output clock signal and based on the lock signal.

5. A method of determining a bandwidth of a clock circuit embedded in an integrated circuit, the method comprising:
   generating an input clock signal based on a reference clock signal;
   extending a phase of the input clock signal by inserting a phase step into the reference clock signal in response to a trigger signal, the extending a phase of the input clock signal comprising generating a synchronized trigger signal by synchronizing the trigger signal with the reference clock signal, generating an inverted trigger signal based on the synchronized trigger signal, generating a delayed trigger signal based on the synchronized trigger signal and the reference clock signal, generating a filter signal based on the inverted trigger signal and the delayed trigger signal, generating an inverted reference clock signal by inverting the reference clock signal, generating an offset trigger signal based on the synchronized trigger signal and the inverted reference clock signal, generating a phase-extended signal by selecting the reference clock signal or the inverted reference clock signal based on the offset trigger signal and filtering the phase-extended signal based on the filter signal;
   generating an output clock signal based on the input clock signal; and
   determining a bandwidth of the clock circuit based on the output clock signal.

* * * * *